(12) United States Patent
Nandi et al.

(10) Patent No.: US 9,705,524 B2
(45) Date of Patent: Jul. 11, 2017

(54) R2R DIGITAL-TO-ANALOG CONVERTER CIRCUIT

(71) Applicant: TEXAS INSTRUMENTS INCORPORATED, Dallas, TX (US)

(72) Inventors: Gautam Salil Nandi, Bangalore (IN); Sundarasiva Rao Giduturi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/337,929

(22) Filed: Oct. 28, 2016

(65) Prior Publication Data

US 2017/0126244 A1   May 4, 2017

(30) Foreign Application Priority Data

Oct. 30, 2015   (IN) ............................ 5870/CHE/2015

(51) Int. Cl.
*H03M 1/66* (2006.01)
*H03M 1/78* (2006.01)

(52) U.S. Cl.
CPC ................................... *H03M 1/785* (2013.01)

(58) Field of Classification Search
CPC .......... H03M 1/78; H03M 1/785; H03M 1/00; H03M 1/16

USPC ......................................... 341/144, 154, 136
See application file for complete search history.

(56) References Cited

U.S. PATENT DOCUMENTS

| | | | | |
|---|---|---|---|---|
| 4,727,874 A * | 3/1988 | Bowers | ..................... | H03F 1/52 330/207 A |
| 6,061,289 A * | 5/2000 | Itoh | ........................ | H03M 1/68 365/189.09 |
| 7,965,211 B1* | 6/2011 | Landt | ..................... | H03M 1/76 341/137 |

* cited by examiner

*Primary Examiner* — Peguy Jean Pierre
(74) *Attorney, Agent, or Firm* — Gregory J. Albin; Charles A. Brill; Frank D. Cimino

(57) ABSTRACT

One example includes an R2R digital-to-analog converter (DAC) circuit. The circuit includes at least one scaling circuit configured to apply a scale-factor with respect to a nominal voltage range defined by a low-voltage rail and a reference voltage to define a scaled voltage range. The scale-factor can be positive and less than one. The circuit also includes an R2R ladder circuit configured to generate an analog ladder voltage corresponding to a digital input signal. The analog ladder voltage can have an amplitude in the scaled voltage range. The circuit further includes an output stage configured to apply an inverse of the scale-factor to the analog ladder voltage to generate an output voltage.

20 Claims, 3 Drawing Sheets

R2R DIGITAL-TO-ANALOG CONVERTER CIRCUIT

RELATED APPLICATIONS

This application claims priority from Indian Patent Application Serial No. 5870/CHE/2015, filed 30 Oct. 2015, which is incorporated herein in its entirety.

TECHNICAL FIELD

This disclosure relates generally to electronic circuits, and more specifically to an R2R digital-to-analog converter circuit.

BACKGROUND

Computer systems and communications systems have implemented digital signal control for many years. To implement digital control, computer and communications systems typically implement converters for converting analog voltage signals to the digital domain and for converting digital signals to the analog domain. Such digital-to-analog converters (DACs) can be implemented in a variety of ways. One such type of DAC is an R2R DAC circuit in which multiple bits from a digital signal are selectively provided to a resistor/2*resistor ladder via switches to generate an output voltage having an amplitude that corresponds to the value of the digital signal. The output voltage is thus generated based on a current flow between a high-rail reference voltage and ground in a typical R2R DAC circuit and through selected resistors via the activated switches.

SUMMARY

One example includes an R2R digital-to-analog converter (DAC) circuit. The circuit includes at least one scaling circuit configured to apply a scale-factor with respect to a nominal voltage range defined by a low-voltage rail and a reference voltage to define a scaled voltage range. The scale-factor can be positive and less than one. The circuit also includes an R2R ladder circuit configured to generate an analog ladder voltage corresponding to a digital input signal. The analog ladder voltage can have an amplitude in the scaled voltage range. The circuit further includes an output stage configured to apply an inverse of the scale-factor to the analog ladder voltage to generate an output voltage.

Another example includes an R2R DAC circuit. The circuit includes a first scaling circuit configured to generate a maximum scaled voltage based on a reference voltage. The maximum scaled voltage can have an amplitude that is less than the reference voltage. The circuit also includes a second scaling circuit configured to generate a minimum scaled voltage based on the reference voltage. The minimum scaled voltage can have an amplitude that is less than the maximum scaled voltage and greater than a low-voltage rail, such that the minimum scaled voltage and the maximum scaled voltage define a nominal amplitude range that is scaled relative to a scaled amplitude range defined by the reference voltage and the low-voltage rail by a scale-factor. The circuit also includes an R2R ladder circuit configured to generate an analog ladder voltage corresponding to a digital input signal. The analog ladder voltage can have an amplitude in the scaled voltage range. The circuit further includes an output stage configured to apply an inverse of the scale-factor to the analog ladder voltage to generate an output voltage having an amplitude in the scaled amplitude range.

Another example includes an R2R DAC circuit. The circuit includes an at least one scaling circuit configured to apply a scale-factor with respect to a nominal voltage range between a low-voltage rail and a reference voltage to define a scaled voltage range. The scale-factor can be positive and less than one. The circuit also includes an R2R ladder circuit configured to generate an analog ladder voltage corresponding to a digital input signal, the analog ladder voltage having an amplitude in the scaled voltage range. The R2R ladder circuit includes a plurality of stages. Each of the plurality of stages includes a first transistor configured to switch a first voltage to the respective one of the plurality of stages in response to a respective bit of the digital input signal. Each of the plurality of stages also includes a second transistor configured to switch a second voltage to the respective one of the plurality of stages in response to a complement of the respective bit of the digital input signal. The first voltage is greater than the second voltage, and the first and second transistors are the same transistor type. The circuit further includes an output stage configured to apply an inverse of the scale-factor to the analog ladder voltage to generate an output voltage.

DETAILED DESCRIPTION

This disclosure relates generally to electronic circuits, and more specifically to an R2R digital-to-analog converter (DAC) circuit. The R2R DAC circuit can be configured to convert a digital input signal (e.g., a digital voltage signal) that includes a plurality of bits into a corresponding analog output voltage. The R2R DAC circuit can include at least one scaling circuit to scale a nominal voltage range to a scaled voltage range based on a predetermined scale-factor (e.g., that is positive and less than one). The nominal voltage range can be defined by a low-voltage rail (e.g., ground) as a minimum voltage and a reference voltage as a maximum voltage. The nominal voltage range can correspond to a voltage range in which the analog output voltage can have an amplitude. The scaling circuit(s) can thus generate the scaled voltage range based on at least one of the low-voltage rail and the reference voltage to define the scaled voltage range as having a maximum voltage that is less than the reference voltage, and can also have a minimum voltage that is greater than the low-voltage range.

The R2R DAC circuit can also include an R2R ladder circuit configured to generate a ladder voltage corresponding to the digital input signal, with the ladder voltage having an amplitude in the scaled voltage range. The ladder voltage can be provided to an output stage that can be configured to apply an inverse of the scale-factor to the ladder voltage to provide the output voltage as an analog voltage corresponding to the digital input signal and occupying the nominal voltage range. As an example, the output stage can include an amplifier and a resistive arrangement that is configured to convert the amplitude of the ladder voltage to the output voltage. As a result, the output voltage can occupy the nominal voltage range, such as in a full rail-to-rail power range of the integrated circuit (IC) chip in which the R2R DAC circuit is included. In addition, the stages of the R2R ladder circuit can implement substantially the same transistor type, and can be controlled via substantially equal voltages in response to the respective bits of the digital input signal. As a result, the output voltage can be provided in a substantially precise and linear manner in response to the digital input signal.

Figure 1:
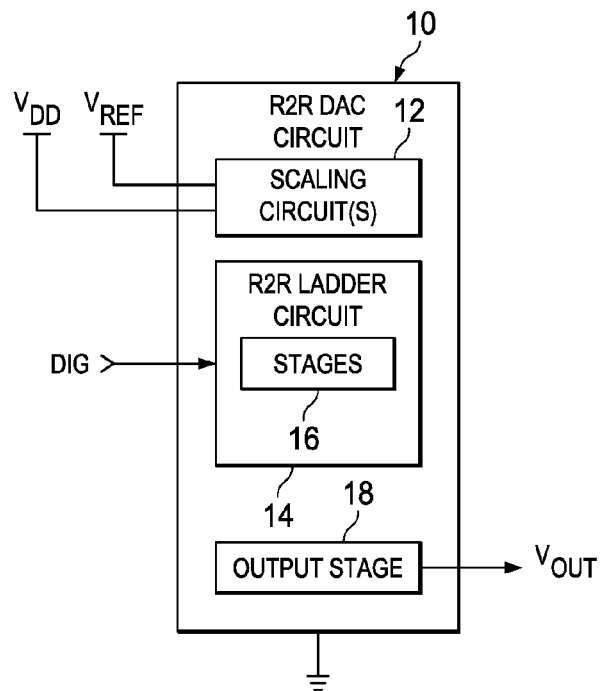
FIG. 1 illustrates an example of an R2R DAC circuit.

FIG. 1 illustrates an example of an R2R DAC circuit 10. The R2R DAC circuit 10 can be implemented in any of a variety of applications that require conversion of a digital signal to an analog signal. The R2R DAC circuit 10 may be configured to convert a digital input signal DIG into an analog output voltage $V_{OUT}$, such that the output voltage $V_{OUT}$ has an amplitude that corresponds to the digital value of the digital input signal DIG. In the example of FIG. 1, the R2R DAC circuit 10 can generate the output voltage $V_{OUT}$ in a nominal voltage range that is defined by a reference voltage $V_{REF}$ as a maximum amplitude and as a low-voltage rail voltage, which is demonstrated in the example of FIG. 1 as ground to correspond to a minimum amplitude of zero volts.

In the example of FIG. 1, the R2R DAC circuit 10 includes at least one scaling circuit 12 that is configured to apply a scale-factor to scale the nominal voltage range to generate a scaled voltage range, such as based on the reference voltage $V_{REF}$ and a power rail voltage $V_{DD}$. As an example, the power voltage $V_{DD}$ and the reference voltage $V_{REF}$ can be approximately equal. For example, the scale-factor can be positive and less than one to generate the scaled voltage range as having a maximum amplitude that is less than the reference voltage $V_{REF}$. As another example, the scaled voltage range can have a minimum amplitude that is greater than the low-voltage range. The R2R DAC circuit 10 also includes an R2R ladder circuit 14 that is configured to generate a ladder voltage in response to the digital input signal DIG. Based on the scaled voltage range generated by the scaling circuit(s) 12, the R2R ladder circuit 14 generates the ladder voltage as having an amplitude in the scaled voltage range. In the example of FIG. 1, the R2R ladder circuit 14 includes a plurality of stages 16 that are selectively switched based on respective bits of the digital input signal DIG, such that the stages 16 of the R2R ladder circuit can provide a selective current through the R2R ladder circuit 14 to generate the ladder voltage based on the selective activation of the switches in each of the stages 16. As described in greater detail herein, the stages 16 can each include sets of substantially identical transistors to substantially mitigate distortion of the ladder voltage.

As described herein, the term "scaled voltage range" corresponds to a proportional amplitude range that is a proper subset of the nominal voltage range, such that a digital value of the digital input signal DIG results in an amplitude of the ladder voltage that has proportional amplitude with respect to the desired output voltage $V_{OUT}$ based on the scale-factor. Therefore, the amplitude of the ladder voltage is proportional to the intended value of the output voltage $V_{OUT}$ that corresponds to the digital value of the digital signal DIG. The R2R DAC circuit 10 further includes an output stage 18 that is configured to generate the output voltage $V_{OUT}$ based on the ladder voltage generated by the R2R ladder circuit 14 in response to the digital input signal DIG. The output stage 18 can include, for example, an amplifier and a resistive arrangement that is configured to convert the ladder voltage to the output voltage $V_{OUT}$. For example, the output stage 18 can be configured to apply an inverse of the scale-factor, such that the output stage 18 provides the output voltage $V_{OUT}$ in the nominal voltage range in a manner that is proportional to the ladder voltage in the scaled voltage range. Accordingly, the output voltage $V_{OUT}$ can be provided in a voltage range between the reference voltage $V_{REF}$ and the low-voltage rail.

Therefore, the scaling circuit(s) 12 generates the scaled voltage range, such that the digital input signal DIG is converted to the analog ladder voltage by the R2R ladder circuit 14, and the output stage 18 converts the analog ladder voltage to the output voltage $V_{OUT}$. As a result, the R2R DAC circuit 10 provides a more accurate conversion of the digital input signal DIG by providing the output voltage $V_{OUT}$ as being substantially linear in the entirety of the nominal voltage range, as opposed to typical R2R DAC circuits that can provide code-dependent errors at the more extreme amplitudes in the nominal voltage range based on the resistors that provide current flow through the respective R2R ladder circuits. Additionally, by implementing the scaled voltage range in the conversion of the digital input signal DIG, the R2R DAC circuit 10 can provide sufficient headroom at the maximum amplitude of the nominal voltage range to thus provide the capability of setting the reference voltage $V_{REF}$ to be approximately equal to the power rail voltage $V_{DD}$. Therefore, the R2R DAC circuit 10 provides a substantially more accurate output voltage $V_{OUT}$ in response to the digital input signal DIG than typical R2R DAC circuits.

In example implementations of the R2R DAC circuit 10 in the example of FIG. 1, the scaling circuit 12 and the R2R ladder circuit 16 may be coupled to each other, and that the output stage 18 and the R2R ladder circuit 16 may be coupled to each other. In some examples, the output stage 18 may be coupled to the scaling circuit 12.

Figure 2:
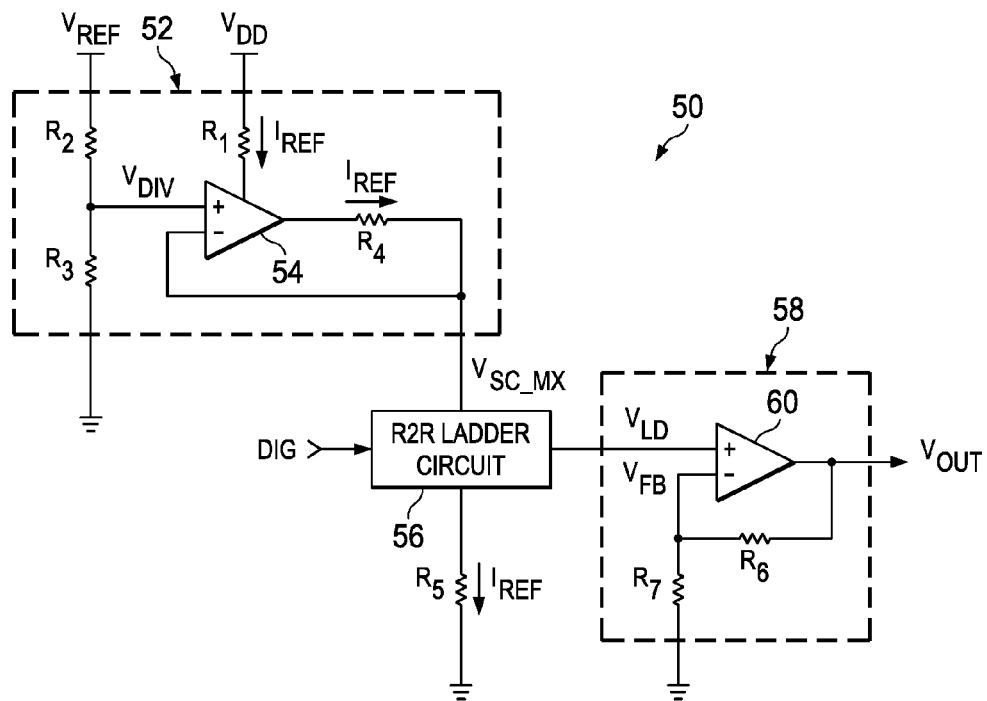
FIG. 2 illustrates another example of an R2R DAC circuit.

FIG. 2 illustrates another example of an R2R DAC circuit 50. The R2R DAC circuit 50 can correspond to the R2R DAC circuit 10 in the example of FIG. 1, and is thus configured to generate an analog output voltage $V_{OUT}$ in response to a digital input signal DIG. Similar to as described previously in the example of FIG. 1, the R2R DAC circuit 50 can generate the output voltage $V_{OUT}$ in a nominal voltage range that is defined by a reference voltage $V_{REF}$ as a maximum amplitude and as a low-voltage rail voltage, which is demonstrated in the example of FIG. 2 as ground to correspond to a minimum amplitude of zero volts.

In the example of FIG. 2, the R2R DAC circuit 50 includes a scaling circuit 52. The scaling circuit 52 includes an amplifier 54 that is powered via the power rail voltage $V_{DD}$ through a resistor $R_1$. The scaling circuit 52 also includes a resistor $R_2$ and a resistor $R_3$ that are arranged as a voltage-divider between the reference voltage $V_{REF}$ and the low-voltage rail, thus providing a voltage $V_{DIV}$ to a non-inverting input of the amplifier 54. The amplifier 54 is configured to provide a scaled voltage $V_{SC\_MX}$ via a resistor $R_4$, such that the scaled voltage $V_{SC\_MX}$ is provided to the inverting input of the amplifier 54 in a feedback manner. As an example, the amplitude of the scaled voltage $V_{SC\_MX}$ can be approximately equal to the amplitude of the voltage $V_{DIV}$ based on the arrangement and operation of the amplifier 54. The scaling circuit 52 is thus configured to scale the reference voltage $V_{REF}$ by a scale-factor based on the voltage-divider of the resistors $R_2$ and $R_3$ and the amplifier 54 to generate the scaled voltage $V_{SC\_MX}$ that corresponds to a maximum amplitude of the scaled voltage range that is less than the reference voltage $V_{REF}$ corresponding to the maximum amplitude of the nominal voltage range. Therefore, in the example of FIG. 2, the scaled voltage range is defined as having a maximum amplitude of the scaled voltage $V_{SC\_MX}$ and a minimum amplitude of the low-voltage rail.

The R2R DAC circuit 50 also includes an R2R ladder circuit 56 that is configured to generate a ladder voltage $V_{LD}$ based on the voltage $V_{SC\_MX}$ in response to the digital input signal DIG. Based on the scaled voltage range defined by the voltage $V_{SC\_MX}$ and the low-voltage rail, as generated by the scaling circuit 52, the R2R ladder circuit 56 generates the ladder voltage $V_{LD}$ as having an amplitude that occupies the scaled voltage range. As an example, the R2R ladder circuit 56 can include a plurality of stages that are selectively switched based on respective bits of the digital input signal DIG. As a result, a current $I_{REF}$ is provided through the R2R ladder circuit 56 to set the amplitude of the ladder voltage $V_{LD}$ based on the selective activation of the switches in each of the stages. Thus, the reference current $I_{REF}$ can have an amplitude that is based on the selective activation of the switches in the respective stages of the R2R ladder circuit 56, and thus based on the resistive arrangement of the activated stages of the R2R ladder circuit 56, based on the digital code of the digital input signal DIG. In the example of FIG. 2, the reference current $I_{REF}$ flows from the power rail $V_{DD}$ through the resistor $R_1$, through the amplifier 54, through the resistor R4, through zero or more stages the R2R ladder circuit 56, and through a resistor $R_5$ to the low-voltage rail. Accordingly, the amplitude of the ladder voltage $V_{LD}$ is set based on the amplitude of the reference current $I_{REF}$, and occupies the scaled voltage range between the low-voltage rail as a minimum and the scaled voltage $V_{SC\_MX}$ as a maximum.

The R2R DAC circuit 50 further includes an output stage 58 that is configured to generate the output voltage $V_{OUT}$ based on the ladder voltage $V_{LD}$. The output stage 58 includes an amplifier 60 that receives the ladder voltage $V_{LD}$ at a non-inverting input. The amplifier 60 is configured to generate the output voltage $V_{OUT}$ at an output. The output stage 58 also includes a resistor $R_6$ and a resistor $R_7$ that are arranged as a voltage-divider between the output voltage $V_{OUT}$ and the low-voltage rail, thus providing a feedback voltage $V_{FB}$ to an inverting input of the amplifier 60. Therefore, based on the arrangement of the amplifier 60 and the voltage-divider formed by the resistors $R_6$ and $R_7$, the output stage 58 is configured to apply an inverse of the scale-factor to the ladder voltage $V_{LD}$. The inverse scale-factor may be achieved, in some examples, by configuring the resistances of resistors $R_2$, $R_3$, $R_6$ and $R_7$ such that the ratio of the resistors $R_2$ to $R_3$ equals the ratio of the resistors $R_6$ to $R_7$ (i.e., $R_2/R_3=R_6/R_7$). As a result, the output stage 58 provides the output voltage $V_{OUT}$ in the nominal voltage range in a manner that is proportional to the ladder voltage $V_{LD}$ in the scaled voltage range. Accordingly, the output voltage $V_{OUT}$ is provided in a voltage range between the reference voltage $V_{REF}$ and the low-voltage rail.

Therefore, the R2R DAC circuit 50 is configured to generate the ladder voltage $V_{LD}$ to occupy the scaled voltage range and to convert the ladder voltage $V_{LD}$ to the output voltage $V_{OUT}$ in the nominal voltage range. As a result, the R2R DAC circuit 50 provides a more accurate conversion of the digital input signal DIG by providing the output voltage $V_{OUT}$ as being substantially linear at higher amplitudes of the nominal voltage range. Additionally, by implementing the scaled voltage range in the conversion of the digital input signal DIG, the R2R DAC circuit 50 can provide sufficient headroom at the maximum amplitude of the nominal voltage range to thus provide the capability of setting the reference voltage $V_{REF}$ to be approximately equal to the power rail voltage $V_{DD}$. It is to be understood that the R2R DAC circuit 50 is but one example of a R2R DAC circuit as described herein. For example, the scaling circuit 52 and the output stage 58 could, for example, be configured to provide different values of the scale-factor (e.g., via selected values of the resistors), such that the inverse scale-factor that is provided by the output stage 58 is different from the scale-factor provided by the scaling circuit 52. Additionally, the scaling circuit 52 could be provided with respect to the low-voltage rail, such that the minimum amplitude of the scaled voltage range could be greater than the low-voltage rail, even without a scaling of the reference voltage $V_{REF}$, as an example. Accordingly, the R2R DAC circuit 50 can be configured in a variety of ways.

Figure 3:
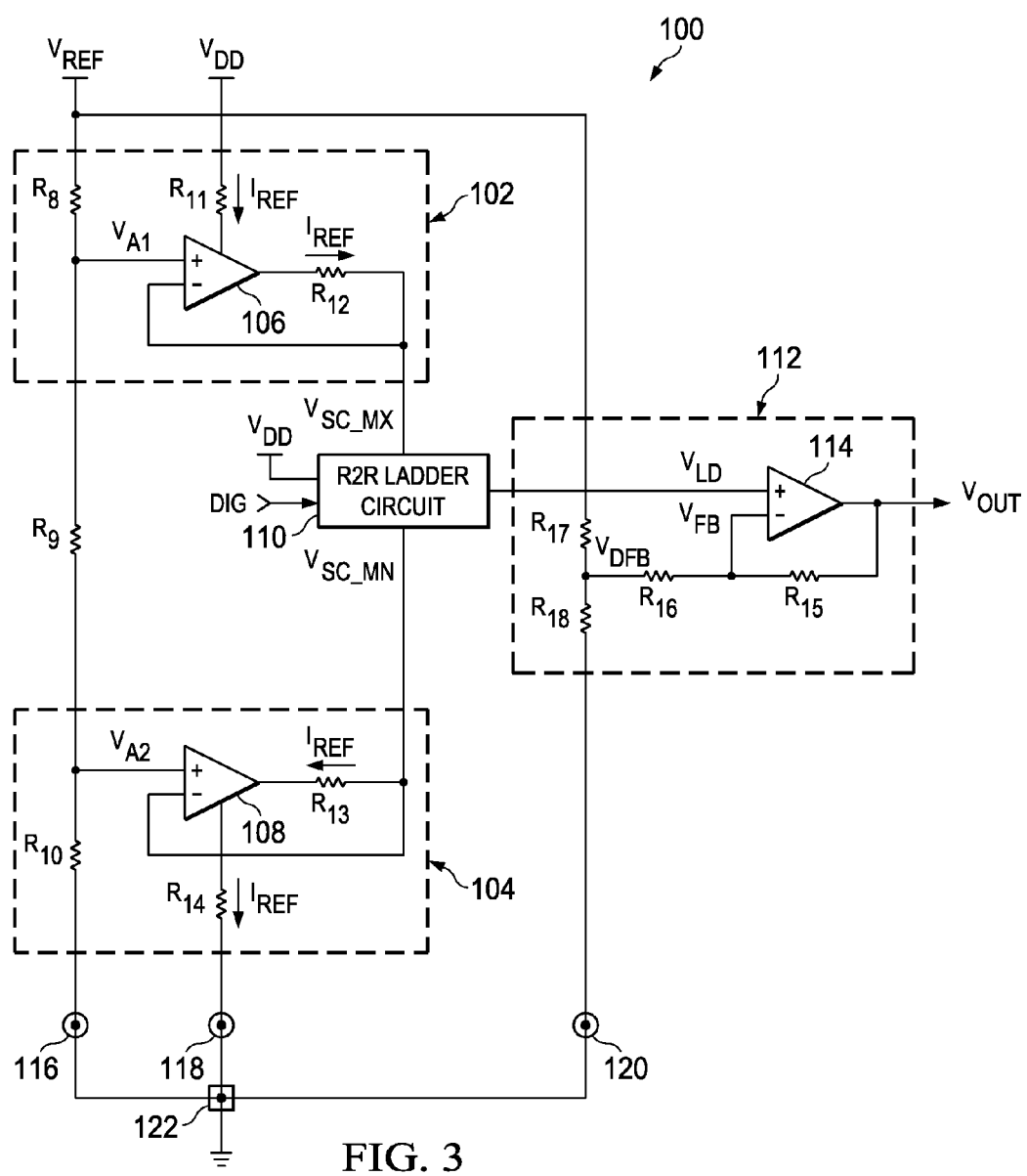
FIG. 3 illustrates yet another example of an R2R DAC circuit.

FIG. 3 illustrates another example of an R2R DAC circuit 100. The R2R DAC circuit 100 can correspond to the R2R DAC circuit 10 in the example of FIG. 1, and is thus configured to generate an analog output voltage $V_{OUT}$ in response to a digital input signal DIG. Similar to as described previously in the example of FIG. 1, the R2R DAC circuit 100 can generate the output voltage $V_{OUT}$ in a nominal voltage range that is defined by a reference voltage $V_{REF}$ as a maximum amplitude and as a low-voltage rail voltage, which is demonstrated in the example of FIG. 3 as ground to correspond to a minimum amplitude of zero volts.

In the example of FIG. 3, the R2R DAC circuit 100 includes a first scaling circuit 102 and a second scaling circuit 104. The first scaling circuit 102 includes a resistor $R_8$ that is arranged between the reference voltage $V_{REF}$ and a resistor $R_9$, and the second scaling circuit 104 includes a resistor $R_{10}$ that is arranged between the resistor $R_9$ and the low-voltage rail, demonstrated in the example of FIG. 3 as ground. Therefore, the resistors $R_8$ and $R_9$ are arranged as a first voltage-divider that generates a voltage $V_{A1}$, and the resistors $R_9$ and $R_{10}$ are arranged as a second voltage-divider that generates a voltage $V_{A2}$. As an example, with reference to the R2R DAC circuit 50 in the example of FIG. 2, the resistor $R_8$ can have a resistance value that is approximately equal to a difference between the resistance values of the resistors $R_1$ and $R_{10}$, and the resistance value of the resistor $R_9$ can be approximately equal to the resistance value of the resistor $R_2$. Thus, the voltage $V_{A1}$ can have an amplitude that is approximately equal to a sum of the voltage $V_{DIV}$ and $V_{A2}$.

The first scaling circuit 102 includes an amplifier 106 that is powered via the power rail voltage $V_{DD}$ through a resistor $R_{11}$ and which receives the voltage $V_{A1}$ at a non-inverting input. The amplifier 106 is configured to provide a scaled voltage $V_{SC\_MX}$ via a resistor $R_{12}$, such that the scaled voltage $V_{SC\_MX}$ is provided to the inverting input of the amplifier 106 in a feedback manner. As an example, the amplitude of the scaled voltage $V_{SC\_MX}$ can be approximately equal to the amplitude of the voltage $V_{A1}$ based on the arrangement and operation of the amplifier 106. The first scaling circuit 102 is thus configured to scale down the reference voltage $V_{REF}$ based on the voltage-divider of the resistors $R_8$ and $R_9$ and the amplifier 106 to generate the scaled voltage $V_{SC\_MX}$ that corresponds to a maximum amplitude of the scaled voltage range that is less than the reference voltage $V_{REF}$ corresponding to the maximum amplitude of the nominal voltage range. Therefore, in the example of FIG. 3, the scaled voltage range is defined as having a maximum amplitude of the scaled voltage $V_{SC\_MX}$.

The second scaling circuit 104 includes an amplifier 108 that is coupled to the low-voltage rail through a resistor $R_{13}$ and which receives the voltage $V_{A2}$ at a non-inverting input. The amplifier 108 is configured to provide a scaled voltage $V_{SC\_MN}$ via a resistor $R_{14}$, such that the scaled voltage $V_{SC\_MN}$ is provided to the inverting input of the amplifier 108 in a feedback manner. As an example, the amplitude of the scaled voltage $V_{SC\_MN}$ can be approximately equal to the amplitude of the voltage $V_{A2}$ based on the arrangement and operation of the amplifier 108. The second scaling circuit 104 is thus configured to scale up the low-voltage rail based on the voltage-divider of the resistors $R_9$ and $R_{10}$ and the amplifier 108 to generate the scaled voltage $V_{SC\_MN}$ that corresponds to a minimum amplitude of the scaled voltage range that is greater than the low-voltage rail (e.g., zero) corresponding to the minimum amplitude of the nominal voltage range. Therefore, in the example of FIG. 3, the scaled voltage range is defined as having a minimum amplitude of the scaled voltage $V_{SC\_MN}$. Accordingly, the nominal voltage range defined by the low-voltage rail and the reference voltage $V_{REF}$ is collectively scaled by the scaling circuits 102 and 104 by a scale-factor to generate the scaled voltage range defined by the scaled voltages $V_{SC\_MN}$ and $V_{SC\_MX}$.

The R2R DAC circuit 100 also includes an R2R ladder circuit 110 that is configured to generate a ladder voltage $V_{LD}$ based on the voltages $V_{SC\_MX}$ and $V_{SC\_MN}$ in response to the digital input signal DIG. Based on the scaled voltage range defined by the voltages $V_{SC\_MX}$ and $V_{SC\_MN}$, as generated by the scaling circuits 102 and 104, the R2R ladder circuit 110 generates the ladder voltage $V_{LD}$ as having an amplitude that occupies the scaled voltage range. As an example, the R2R ladder circuit 110 can include a plurality of stages that are selectively switched based on respective bits of the digital input signal DIG. As a result, a current $I_{REF}$ is provided through the R2R ladder circuit 110 to set the amplitude of the ladder voltage $V_{LD}$ based on the selective activation of the switches in each of the stages. Thus, the reference current $I_{REF}$ can have an amplitude that is based on the selective activation of the switches in the respective stages of the R2R ladder circuit 110, and thus based on the resistive arrangement of the activated stages of the R2R ladder circuit 110, based on the digital code of the digital input signal DIG. In the example of FIG. 3, the reference current $I_{REF}$ flows from the power rail $V_{DD}$ through the resistor $R_{11}$, through the amplifier 106, through the resistor $R_{12}$, through zero or more stages the R2R ladder circuit 110, through the resistor $R_{14}$, through the amplifier 108, and through the resistor $R_{13}$ to the low-voltage rail. Accordingly, the amplitude of the ladder voltage $V_{LD}$ is set based on the amplitude of the reference current $I_{REF}$, and occupies the scaled voltage range between the scaled voltage $V_{SC\_MN}$ as a minimum and the scaled voltage $V_{SC\_MN}$ as a maximum.

The R2R DAC circuit 100 further includes an output stage 112 that is configured to generate the output voltage $V_{OUT}$ based on the ladder voltage $V_{LD}$. The output stage 112 includes an amplifier 114 that receives the ladder voltage $V_{LD}$ at a non-inverting input. The amplifier 114 is configured to generate the output voltage $V_{OUT}$ at an output. The output stage 112 also includes a resistor $R_{15}$ and a resistor $R_{16}$ that are arranged as a first voltage-divider between the output voltage $V_{OUT}$ and a divided feedback voltage $V_{DFB}$, thus providing a feedback voltage $V_{FB}$ to an inverting input of the amplifier 114. As an example, the resistor $R_{15}$ can have a resistance value that is approximately equal to a sum of the resistance values of the resistors $R_8$ and $R_9$, and the resistor $R_{16}$ can have a resistance value that is approximately equal to the resistance value of the resistor $R_{10}$. The divided voltage $V_{DFB}$ is generated via a second voltage divider corresponding to a resistor $R_{17}$ and a resistor $R_{18}$ arranged between the reference voltage $V_{REF}$ and the low-voltage rail. Therefore, based on the arrangement of the amplifier 114 and the voltage-dividers formed by the resistors $R_{15}$ and $R_{16}$ and the resistors $R_{17}$ and $R_{18}$, respectively, the output stage 112 is configured to apply an inverse of the scale-factor to the ladder voltage $V_{LD}$. As a result, the output stage 112 provides the output voltage $V_{OUT}$ in the nominal voltage range in a manner that is proportional to the ladder voltage $V_{LD}$ in the scaled voltage range. Accordingly, the output voltage $V_{OUT}$ is provided in a voltage range between the reference voltage $V_{REF}$ and the low-voltage rail.

In addition, in the example of FIG. 3, the resistor $R_{10}$ is coupled to a first bond pad 116, the resistor $R_{14}$ is coupled to a second bond pad 118, and the resistor $R_{18}$ is coupled to a third bond pad 120. As an example, each of the bond pads 116, 118, and 120 correspond to separate bond pad portions of an integrated circuit (IC) chip in which the R2R DAC circuit 100 is included, such as during a fabrication process. In the example of FIG. 3, the bond pads 116, 118, and 120 are each coupled to a single ground pin 122, such as corresponding to a single pin of the associated IC chip. As a result of separating the bond pads 116, 118, and 120 with respect to the ground connections of the R2R DAC circuit 100, the effects of bond-wire impedance on the linearity of the R2R DAC circuit 100 can be substantially mitigated. While the separation of the ground connections to the separate bond pads 116, 118, and 120 is demonstrated in the example of FIG. 3, it is to be understood that the R2R DAC circuit 50 in the example of FIG. 2 could likewise have separate bond pads for the respective ground connections.

Figure 4:
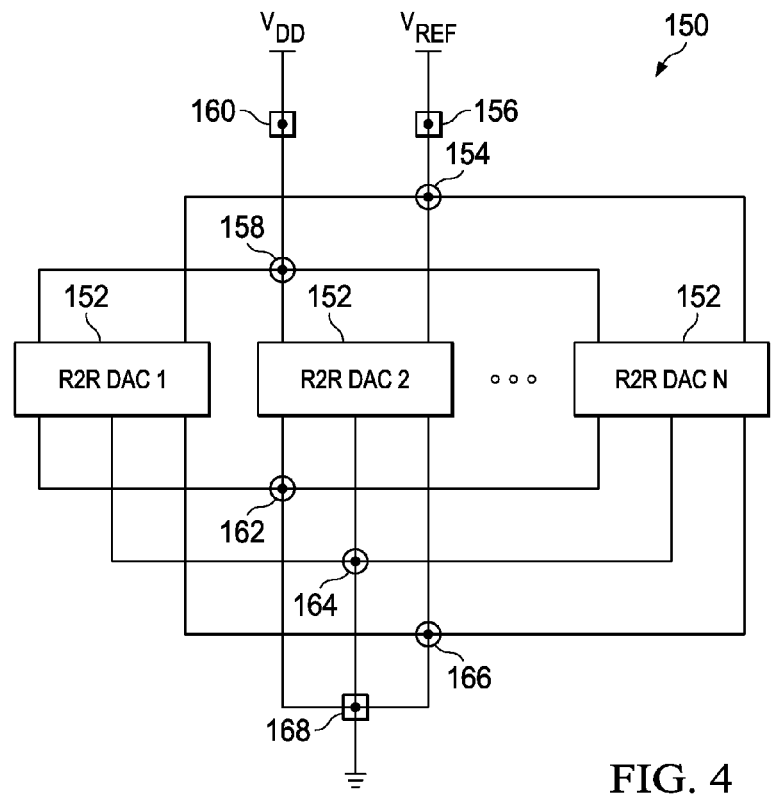
FIG. 4 illustrates an example of an R2R DAC system.

Additionally, multiple R2R DAC circuits 100 can be implemented in the same IC (e.g., on the same die). FIG. 4 illustrates an example of an R2R DAC system 150. The R2R DAC system 150 can be implemented as or as part of an IC chip. The R2R DAC system 150 includes a plurality N of separate R2R DAC circuits 152. As an example, each of the R2R DAC circuits 152 can correspond to any of the R2R DAC circuits 10, 50, and 100 in the respective examples of FIGS. 1-3. In the example of FIG. 4, the R2R DAC circuits 152 are each coupled to a bond pad 154 that is coupled to a pin 156 on which the reference voltage $V_{REF}$ is provided. Similarly, the R2R DAC circuits 152 are each coupled to a bond pad 158 that is coupled to a pin 160 on which the rail voltage $V_{DD}$ is provided. As an example, the reference voltage $V_{REF}$ and the rail voltage $V_{DD}$ can be substantially equal, and can be coupled together via a single-pin, similar to as described previously. In addition, the R2R DAC circuits 152 are each coupled to a separate respective bond pads 162, 164, and 166 that are all coupled to a ground pin 168 that is coupled to the low-voltage rail (e.g., ground). As an example, the bond pads 162, 164, and 166 can correspond, respectively, to the bond pads 116, 118, and 120 in the example of FIG. 3. Based on the separation of the bond pads 162, 164, and 166 with respect to the ground connections of each of the R2R DAC circuits 152, the effects of bond-wire impedance on the linearity of the R2R DAC circuits 152 can be substantially mitigated, similar to as described previously. Additionally, the code-dependent current $I_{REF}$ for each of the R2R DAC circuits 152 will exhibit substantially less cross-talk relative to each other. Accordingly, the output voltage $V_{OUT}$ of each of the R2R DAC circuits 202 can be provided in a more accurate manner.

Figure 5:
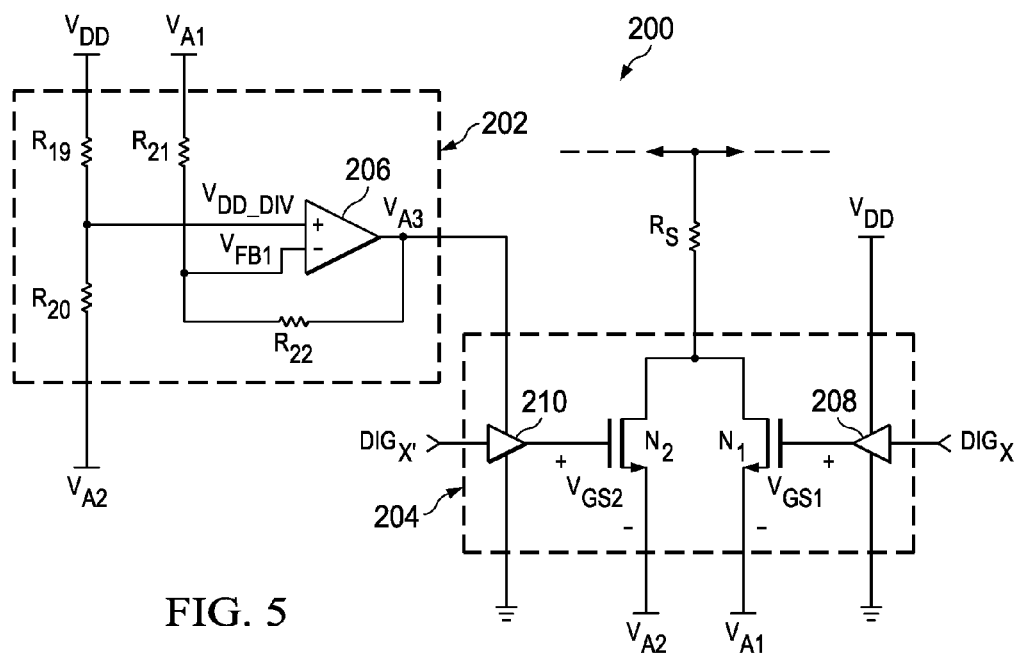
FIG. 5 illustrates an example of an R2R ladder circuit stage.

As described previously, the R2R ladder circuits 14, 56, and 110 can include a plurality of stages. FIG. 5 illustrates an example of an R2R ladder circuit stage 200. The R2R ladder circuit stage 200 can correspond to a single stage of the plurality of stages in any of the R2R ladder circuits 14, 56, and 110. Therefore, reference is to be made to the examples of FIGS. 1-3 in the following description of the example of FIG. 5. As an example, each of the stages of the R2R ladder circuits 14, 56, and 110 can be arranged substantially similar to the R2R ladder circuit stage 200.

The R2R ladder circuit stage 200 includes an amplifier portion 202 and an activation portion 204. The amplifier portion 202 includes an amplifier 206 and a set of resistors $R_{19}$ and $R_{20}$ that are arranged as a voltage-divider between the power rail voltage $V_{DD}$ and the voltage $V_{A2}$. As described previously, for example, the voltage $V_{A2}$ can correspond to the scaled voltage $V_{SC\_MN}$ that is generated by the amplifier 108 in the example of FIG. 3. Thus, the resistors $R_{19}$ and $R_{20}$ provide a voltage $V_{DD\_DIV}$ to a non-inverting input of the amplifier 206. The amplifier 206 is configured to generate a voltage $V_{A3}$ at an output. Additionally, the amplifier portion 202 further includes a voltage-divider associated with resistor $R_{21}$ and a resistor $R_{22}$ arranged between the voltage $V_{A1}$ and the voltage $V_{A3}$ to provide a feedback voltage $V_{FB1}$ at an inverting input of the amplifier 206. As described previously, for example, the voltage $V_{A1}$ can correspond to the scaled voltage $V_{SC\_MX}$ that is generated by the amplifier 106 in the example of FIG. 3.

The activation portion 204 includes a first buffer 208 that is activated via a bit of the digital input signal DIG, demonstrated in the example of FIG. 5 as a signal $DIG_X$, and a second buffer 210 that is activated via a complement of the bit, demonstrated in the example of FIG. 5 as a signal $DIG_X'$. The first buffer 208 is powered via the power rail voltage $V_{DD}$ relative to ground, such that when the bit $DIG_X$ is asserted, the first buffer 208 provides the voltage $V_{DD}$ to a gate of an N-channel transistor (e.g., MOSFET) $N_1$ to activate the N-FET $N_1$. Similarly, the second buffer 210 is powered via the voltage $V_{A3}$ relative to ground, such that when the bit $DIG_X'$ is asserted (concurrently with de-assertion of the bit $DIG_X$), the second buffer 210 provides the voltage $V_{A3}$ to a gate of an N-FET $N_2$ to activate the N-FET $N_2$. In response to activation of the N-FET $N_1$, the N-FET $N_1$ couples the voltage $V_{A1}$, such as provided from the output of the amplifier 106, to a ladder resistor RS associated with the respective R2R ladder circuit. Similarly, in response to activation of the N-FET $N_2$, the N-FET $N_2$ couples the voltage $V_{A2}$, such as provided from the output of the amplifier 108, to a ladder resistor $R_S$ associated with the respective R2R ladder circuit (e.g., a 2*R resistor of the respective R2R ladder circuit). As an example, the N-FETs $N_1$ and $N_2$ can be substantially fabrication matched, such that the N-FETs $N_1$ and $N_2$ are approximately equal with respect to size and process and temperature variations.

As an example, as described previously in the example of FIG. 2, the voltage $V_{A1}$ can have an amplitude that is approximately equal to a sum of the voltage $V_{DIV}$ and the voltage $V_{A2}$. Based on the arrangement of the amplifier 206 and the resistors $R_{19}$ through $R_{22}$ in the amplifier portion 202, the voltage $V_{A3}$ can have an amplitude that is approximately equal to a difference of the rail voltage $V_{DD}$ and the voltage $V_{DIV}$. Therefore, in response to activation of the N-FET $N_1$, the N-FET $N_1$ will have a gate-source voltage $V_{GS1}$ that can be expressed as follows:

$$V_{GS1}=V_{DD}-V_{A1} \qquad \text{Equation 1}$$

$$V_{GS1}=V_{DD}-(V_{DIV}+V_{A2}) \qquad \text{Equation 2}$$

$$V_{GS1}=V_{DD}-V_{DIV}-V_{A2} \qquad \text{Equation 3}$$

Similarly, in response to activation of the N-FET $N_2$, the N-FET $N_2$ will have a gate-source voltage $V_{GS2}$ that can be expressed as follows:

$$V_{GS2}=V_{A3}-V_{A2} \qquad \text{Equation 4}$$

$$V_{GS2}=(V_{DD}-V_{DIV})-V_{A2} \qquad \text{Equation 5}$$

$$V_{GS2}=V_{DD}-V_{DIV}-V_{A2} \qquad \text{Equation 6}$$

As provided in Equations 3 and 6, the activation voltage $V_{GS1}$ of the N-FET $N_1$ and the activation voltage $V_{GS2}$ of the N-FET $N_2$ are approximately equal during the respective activations of the N-FETs $N_1$ and $N_2$. Therefore, because the N-FETs $N_1$ and $N_2$ are fabrication matched and approximately equal in gate size, the N-FETs $N_1$ and $N_2$ have an approximately equal activation resistance $R_{DSON}$ during activation.

Therefore, as a result of the use of transistors that are substantially the same with respect to transistor type and fabrication matching, the activation resistance of the N-FETs $N_1$ and $N_2$ can be approximately equal in each of the logic-states of the bit $DIG_X$ of the digital input signal DIG. As a result, an R2R ladder circuit that implements the R2R ladder circuit stage 200 in each of the stages, such as in the R2R ladder circuits 14, 56, and 110 can exhibit significantly greater linearity in generating the ladder voltage $V_{LD}$ based on the substantially equal activation resistance in each of the logic-states of the bit $DIG_X$. Such a result provides significant benefit over typical R2R ladder circuits that implement high-side/low-side switching via a P-FET/N-FET that have significant differences in activation resistance of the P-FET/N-FET transistor pair based on the fundamental physical differences between the respective transistor devices. Furthermore, the R2R ladder stage 200 can have a significantly smaller die area relative to typical R2R ladder circuits that implement high-side/low-side switching via a P-FET/N-FET transistor pair in each of the R2R ladder circuit stages. As an example, the significant differences in activation resistance of the P-FET/N-FET transistor pair is typically compensated for by greatly increasing the die area of the high-side/low-side switching via a P-FET/N-FET transistor pair in each of the R2R ladder circuit stages. However, by implementing the transistors (e.g., the N-FETs $N_1$ and $N_2$) that are substantially the same with respect to transistor type and fabrication matching, such increase in size of the transistors in the R2R ladder circuit stage 200 is unnecessary, resulting in a much more compact form-factor relative to typical R2R ladder circuits. Accordingly, the R2R DAC circuits 10, 50, 100, and 152 can be implemented in a compact form to provide a more accurate output voltage $V_{OUT}$ corresponding to a respective digital input signal DIG.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An R2R digital-to-analog converter (DAC) circuit comprising:
    at least one scaling circuit configured to apply a scale-factor with respect to a nominal voltage range defined by a low-voltage rail and a reference voltage to define a scaled voltage range, the scale-factor being positive and less than one;

an R2R ladder circuit configured to generate an analog ladder voltage corresponding to a digital input signal, the analog ladder voltage having an amplitude in the scaled voltage range; and an output stage configured to apply an inverse of the scale-factor to the analog ladder voltage to generate an output voltage having an amplitude in the nominal voltage range.

2. The circuit of claim 1, wherein the scaled voltage range is defined by a minimum voltage that is greater than the low-voltage rail and a maximum voltage that is less than the reference voltage.

3. The circuit of claim 1, wherein the at least one scaling circuit comprises a first scaling circuit, the first scaling circuit comprises:

a first voltage divider configured to generate a first divided reference voltage based on the reference voltage; and a first amplifier configured in a feedback arrangement and configured to generate a first scaled voltage based on the first divided reference voltage, the first scaled voltage defining a maximum voltage of the scaled voltage range.

4. The circuit of claim 2, wherein the at least one scaling circuit comprises a second scaling circuit, the second scaling circuit comprising:

a second voltage divider configured to generate a second divided reference voltage based on the reference voltage; and a second amplifier configured in a feedback arrangement and configured to generate a second scaled voltage based on the second divided reference voltage, the scaled voltage defining a non-zero minimum voltage of the scaled voltage range.

5. The circuit of claim 1, wherein the output stage comprises:

an amplifier configured to receive the analog ladder voltage and to apply the inverse of the scale-factor to generate the output voltage based on the analog ladder voltage and a feedback voltage; and a resistive network being arranged in a feedback arrangement with respect to the amplifier to generate the feedback voltage.

6. The circuit of claim 5, wherein the resistive network comprises:

a first voltage divider arranged between the reference voltage and the low-voltage rail to generate a divided voltage; and a second voltage divider arranged between the divided voltage and the output voltage to generate the feedback voltage, such that the output stage applies the inverse of the scale-factor to provide the output voltage that is defined as having a maximum amplitude that is approximately equal to the reference voltage and a minimum amplitude that is approximately equal to the low-voltage rail from the scaled voltage range that is defined by a scaled minimum amplitude that is greater than the low-voltage rail and a scaled maximum amplitude that is less than the reference voltage.

7. The circuit of claim 1, wherein the R2R ladder circuit comprises a plurality of stages, each of the plurality of stages comprising:

a first transistor configured to switch a first voltage to the respective one of the plurality of stages in response to a respective bit of the digital input signal; and a second transistor configured to switch a second voltage to the respective one of the plurality of stages in response to a complement of the respective bit of the digital input signal, wherein the first voltage is greater than the second voltage, wherein the first and second transistors are the same transistor type.

8. The circuit of claim 7, wherein each of the plurality of stages further comprises:

a first buffer configured to activate the first transistor in response to a given logic-state of the respective bit of the digital input signal via a first buffer voltage to provide an activation voltage associated with the first transistor; and a second buffer configured to activate the second transistor in response to the given logic-state of the complement of the respective bit of the digital input signal via a second buffer voltage to provide the activation voltage associated with the second transistor, such that the first and second transistors have an approximately equal activation voltage.

9. The circuit of claim 8, wherein each of the plurality of stages further comprises an amplifier stage configured to generate the second buffer voltage based on a maximum voltage associated with the scaled voltage range via the at least one scaling circuit.

10. An integrated circuit (IC) chip comprising at least a portion of the R2R DAC circuit of claim 1.

11. The IC chip of claim 10, further comprising a plurality of R2R DAC circuits, each of the plurality of R2R DAC circuits being coupled to a plurality of ground pads, wherein the plurality of ground pads are coupled to a ground pin.

12. An R2R digital-to-analog converter (DAC) circuit comprising:

a first scaling circuit configured to generate a maximum scaled voltage based on a reference voltage, the maximum scaled voltage having an amplitude that is less than the reference voltage;

a second scaling circuit configured to generate a minimum scaled voltage based on the reference voltage, the minimum scaled voltage having an amplitude that is less than the maximum scaled voltage and greater than a low-voltage rail, such that the minimum scaled voltage and the maximum scaled voltage define a nominal amplitude range that is scaled relative to a scaled amplitude range defined by the reference voltage and the low-voltage rail by a scale-factor;

an R2R ladder circuit configured to generate an analog ladder voltage corresponding to a digital input signal, the analog ladder voltage having an amplitude in the scaled voltage range; and an output stage configured to apply an inverse of the scale-factor to the analog ladder voltage to generate an output voltage having an amplitude in the scaled amplitude range.

13. The circuit of claim 12, wherein the first scaling circuit comprises:

a first voltage divider configured to generate a first divided reference voltage based on the reference voltage; and a first amplifier configured in a feedback arrangement and configured to generate a first scaled voltage based on the first divided reference voltage, the first scaled voltage defining the maximum scaled voltage;

wherein the second scaling circuit comprises:
a second voltage divider configured to generate a second divided reference voltage based on the reference voltage; and
a second amplifier configured in a feedback arrangement and configured to generate a second scaled voltage based on the second divided reference voltage, the scaled voltage defining the minimum scaled voltage.

14. The circuit of claim 12, wherein the output stage comprises:
an amplifier configured to receive the analog ladder voltage and to apply the inverse of the scale-factor to generate the output voltage based on the analog ladder voltage and a feedback voltage; and
a resistive network being arranged in a feedback arrangement with respect to the amplifier to generate the feedback voltage.

15. The circuit of claim 12, wherein the resistive network comprises:
a first voltage divider arranged between the reference voltage and the low-voltage rail to generate a divided voltage; and
a second voltage divider arranged between the divided voltage and the output voltage to generate the feedback voltage, such that the output stage applies the inverse of the scale-factor to provide the output voltage having the amplitude in the scaled amplitude range.

16. The circuit of claim 12, wherein the R2R ladder circuit comprises a plurality of stages, each of the plurality of stages comprising:
a first transistor configured to switch a first voltage to the respective one of the plurality of stages in response to a respective bit of the digital input signal;
a first buffer configured to activate the first transistor in response to a given logic-state of the respective bit of the digital input signal via a first buffer voltage to provide an activation voltage associated with the first transistor;
a second transistor configured to switch a second voltage to the respective one of the plurality of stages in response to a complement of the respective bit of the digital input signal, wherein the first voltage is greater than the second voltage, wherein the first and second transistors are the same transistor type; and
a second buffer configured to activate the second transistor in response to the given logic-state of the complement of the respective bit of the digital input signal via a second buffer voltage to provide the activation voltage associated with the second transistor, such that the first and second transistors have an approximately equal activation voltage.

17. An R2R digital-to-analog converter (DAC) circuit comprising:
at least one scaling circuit configured to apply a scale-factor with respect to a nominal voltage range between a low-voltage rail and a reference voltage to define a scaled voltage range, the scale-factor being positive and less than one;
an R2R ladder circuit configured to generate an analog ladder voltage corresponding to a digital input signal, the analog ladder voltage having an amplitude in the scaled voltage range, the R2R ladder circuit comprising a plurality of stages, each of the plurality of stages comprising:
a first transistor configured to switch a first voltage to the respective one of the plurality of stages in response to a respective bit of the digital input signal; and
a second transistor configured to switch a second voltage to the respective one of the plurality of stages in response to a complement of the respective bit of the digital input signal, wherein the first voltage is greater than the second voltage, wherein the first and second transistors are the same transistor type; and
an output stage configured to apply an inverse of the scale-factor to the analog ladder voltage to generate an output voltage.

18. The circuit of claim 17, wherein each of the plurality of stages further comprises:
a first buffer configured to activate the first transistor in response to a given logic-state of the respective bit of the digital input signal via a first buffer voltage to provide an activation voltage associated with the first transistor; and
a second buffer configured to activate the second transistor in response to the given logic-state of the complement of the respective bit of the digital input signal via a second buffer voltage to provide the activation voltage associated with the second transistor, such that the first and second transistors have an approximately equal activation voltage.

19. The circuit of claim 17, wherein the scaled voltage range is defined by a minimum voltage that is greater than the low-voltage rail and a maximum voltage that is less than the reference voltage.

20. The circuit of claim 17, wherein the at least one scaling circuit comprises a first scaling circuit and a second scaling circuit, wherein the first scaling circuit comprises:
a first voltage divider configured to generate a first divided reference voltage based on the reference voltage; and
a first amplifier configured in a feedback arrangement and configured to generate a first scaled voltage based on the first divided reference voltage, the first scaled voltage defining a maximum voltage of the scaled voltage range;
wherein the second scaling circuit comprises:
a second voltage divider configured to generate a second divided reference voltage based on the reference voltage; and
a second amplifier configured in a feedback arrangement and configured to generate a second scaled voltage based on the second divided reference voltage, the scaled voltage defining a non-zero minimum voltage of the scaled voltage range.

* * * * *